United States Patent

Yamamoto et al.

(10) Patent No.: US 9,685,949 B2
(45) Date of Patent: Jun. 20, 2017

(54) ESD PROTECTION CIRCUIT AND RF SWITCH

(71) Applicant: Mitsubishi Electric Corporation, Tokyo (JP)

(72) Inventors: Kazuya Yamamoto, Tokyo (JP); Miyo Miyashita, Tokyo (JP); Suguru Maki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 34 days.

(21) Appl. No.: 14/844,736

(22) Filed: Sep. 3, 2015

(65) Prior Publication Data

US 2016/0156178 A1 Jun. 2, 2016

(30) Foreign Application Priority Data

Nov. 28, 2014 (JP) .................................. 2014-241931

(51) Int. Cl.
*H02H 3/22* (2006.01)
*H03K 17/693* (2006.01)
(Continued)

(52) U.S. Cl.
CPC ....... *H03K 17/693* (2013.01); *H01L 27/0255* (2013.01); *H03F 1/52* (2013.01);
(Continued)

(58) Field of Classification Search
USPC .................................................. 361/56, 111
See application file for complete search history.

(56) References Cited

U.S. PATENT DOCUMENTS

| 2013/0234199 A1* | 9/2013 | Liang .................... H01L 23/552 257/133 |
| 2014/0117411 A1 | 5/2014 | Kanaya |
| 2014/0334048 A1* | 11/2014 | Muhonen ............... H02H 9/046 361/56 |

FOREIGN PATENT DOCUMENTS

| JP | 63-102376 A | 5/1988 |
| JP | 2001-332567 A | 11/2001 |
| JP | 2014-086673 A | 5/2014 |

OTHER PUBLICATIONS

Kohama et al. "An Antenna Switch MMIC for GSM/UMTS Handsets Using-E/D Mode JPHEMT Technology", IEEE Radio Frequency Integrated Circuits Symposium, 2005, pp. 509-512.
(Continued)

*Primary Examiner* — Danny Nguyen
(74) *Attorney, Agent, or Firm* — Studebaker & Brackett PC

(57) ABSTRACT

An ESD protection circuit is connected in parallel to a MIM capacitor between a first terminal and a second terminal. First Schottky diodes are connected in series to each other and have anodes connected on the first terminal side and cathodes connected on the second terminal side. Second Schottky diodes are connected in series to each other and connected in anti-parallel to the first Schottky diodes. When an RF signal is inputted to neither the first terminal nor the second terminal, the first terminal has a higher DC voltage than that of the second terminal. The number of the first Schottky diodes is greater than the number of the second Schottky diodes. The number of the second Schottky diodes is set such that an amplitude of the RF signal does not attenuate to predetermined amplitude of the RF signal when the RF signal passes through the MIM capacitor.

3 Claims, 11 Drawing Sheets

(51) Int. Cl.
*H01L 27/02* (2006.01)
*H03F 1/52* (2006.01)
*H03F 3/191* (2006.01)
*H03F 3/24* (2006.01)
*H05K 1/02* (2006.01)
*H02H 9/04* (2006.01)

(52) U.S. Cl.
CPC ............ *H03F 3/191* (2013.01); *H03F 3/245* (2013.01); *H02H 9/046* (2013.01); *H03F 2200/451* (2013.01); *H05K 1/0259* (2013.01)

(56) References Cited

OTHER PUBLICATIONS

Cui et al. (2012) "A Novel Electrostatic Discharge (ESD) Protection Circuit in D-Mode pHEMT Technology", IEEE Compound Semiconductor Integrated Circuit Symposium, 2012.

* cited by examiner

ESD PROTECTION CIRCUIT AND RF SWITCH

BACKGROUND OF THE INVENTION

Field of the Invention

The present invention relates to an ESD protection circuit that protects an MIM capacitor, and an RF switch using the same.

Background Art

FIG. 16 is a diagram illustrating a mobile phone RF front-end block. Recent mobile phone RF front-end blocks are mounted with a plurality of power amplifiers and a plurality of duplexers compatible with WCDMA (Wideband Code Division Multiple Access) (registered trademark)/LTE (Long Term Evolution) so as to cover frequency bands which vary from one service/region to another. There are a growing number of cases such as a multi-band power amplifier module (MB PAM) where a GaAs-HBT (heterojunction bipolar transistor) power amplifier and an RF switch are mounted on one module. A plurality of duplexers with different corresponding transmission bands are provided. For example, band B1 corresponds to a transmission band of 1920 to 1980 MHz, and band B2 corresponds to a transmission band of 1850 to 1910 MHz. A switch SW selects one duplexer. FIG. 17 is a functional block diagram that extracts a chain on one side of the multi-band power amplifier module. An RF signal inputted from an input terminal IN is amplified by a power amplifier PA. The amplified signal is outputted from one of output terminals OUT1 and OUT2 selected by an RF switch SW.

Generally, when a power amplifier and an RF switch are commercialized as a module, each terminal of the module needs to satisfy ESD robustness. In the case of portable products, ESD robustness of 1 kV to 2 kV is required in HBM (human body model) testing. As for ESD surge during HBM testing, a peak current of 0.67 A for 1 kV or 1.3 A for 2 kV is inputted from a terminal normally at a speed of a microsecond order. The current needs to be released to GND within a time of a microsecond order. In the case where the current cannot be released, a transistor, MIM capacitor or wiring may malfunction.

A capacitor having a relatively large value and having almost no influence on RF characteristics is provided at input/output of the RF switch. Along with miniaturization of modules, there are cases where such a capacitor cannot help but be formed on the RF switch. In this case, an MIM capacitor that can be integrated together with the RF switch is usually used for the capacitor. However, since an interlayer insulating film thickness of the MIM capacitor between upper and lower electrodes cannot be increased so much, a reduction of withstand voltage is unavoidable, and the MIM capacitor often breaks down when a surge current passes therethrough. Therefore, an ESD protection circuit needs to be provided to protect the MIM capacitor. However, there are almost no reported cases on such an ESD protection circuit. As an ESD protection circuit used for the RF switch, a combination of an enhancement-mode (E-mode) HEMT and a depletion-mode (D-mode) HEMT is proposed (e.g., see 2005 IEEE RFIC Symp., pp. 509-512, "An Antenna Switch MMIC for GSM/UMTS Handsets Using E/D Mode JPHEMT Technology"). Moreover, an ESD protection circuit using a D-mode dual gate HEMT is also proposed (e.g., see 2012 IEEE CSIC Symp., "A Novel Electrostatic Discharge (ESD) Protection Circuit in D-Mode pHEMT Technology").

SUMMARY OF THE INVENTION

Since 2005 IEEE RFIC Symp., pp. 509-512, "An Antenna Switch MMIC for GSM/UMTS Handsets Using E/D Mode JPHEMT Technology" uses both the E mode and the D mode, this does not match the object of protecting the MIM capacitor in the switch using only the D-mode HEMT. On the other hand, according to 2012 IEEE CSIC Symp., "A Novel Electrostatic Discharge (ESD) Protection Circuit in D-Mode pHEMT Technology," a current flows through a dual gate HEMT only when a surge is applied (when a high voltage is applied), but a current also flows through a trigger diode for a time period other than when a surge is applied. Due to the resistance, the current value is estimated to be small, but this is not appropriate for locations where the current alternates as in the case of the MIM capacitor of the RF switch.

The present invention has been implemented to solve the above-described problems and it is an object of the present invention to provide an ESD protection circuit and an RF switch using the same capable of protecting an MIM capacitor provided in parallel to input/output terminals without affecting transmission power characteristics.

According to the present invention, an ESD protection circuit connected in parallel to a MIM capacitor between a first terminal and a second terminal, includes: a plurality of first Schottky diodes connected in series to each other and having anodes connected on the first terminal side and cathodes connected on the second terminal side; and a plurality of second Schottky diodes connected in series to each other and connected in anti-parallel to the plurality of first Schottky diodes, wherein when an RF signal is inputted to neither the first terminal nor the second terminal, the first terminal has a higher DC voltage than that of the second terminal, the number of the plurality of first Schottky diodes is greater than the number of the plurality of second Schottky diodes, and the number of the plurality of second Schottky diodes is set such that an amplitude of the RF signal does not attenuate to predetermined amplitude of the RF signal when the RF signal passes through the MIM capacitor.

The present invention asymmetrically sets the numbers of diodes, and can thereby suppress leakage during DC bias with the smallest number of diodes, minimize ON resistance and allow an ESD surge to pass therethrough with lowest resistance. It is thereby possible to protect the MIM capacitor provided in series to the input/output terminals without affecting transmission power characteristics.

Other and further objects, features and advantages of the invention will appear more fully from the following description.

BRIEF DESCRIPTION OF THE DRAWINGS

FIG. 13 is a diagram illustrating a gate voltage at which the transistor of the ESD protection circuit according to the second embodiment of the present invention is turned ON.

DETAILED DESCRIPTION OF THE PREFERRED EMBODIMENTS

An ESD protection circuit and an RF switch according to the embodiments of the present invention will be described with reference to the drawings. The same components will be denoted by the same symbols, and the repeated description thereof may be omitted.

First Embodiment

Figure 1:
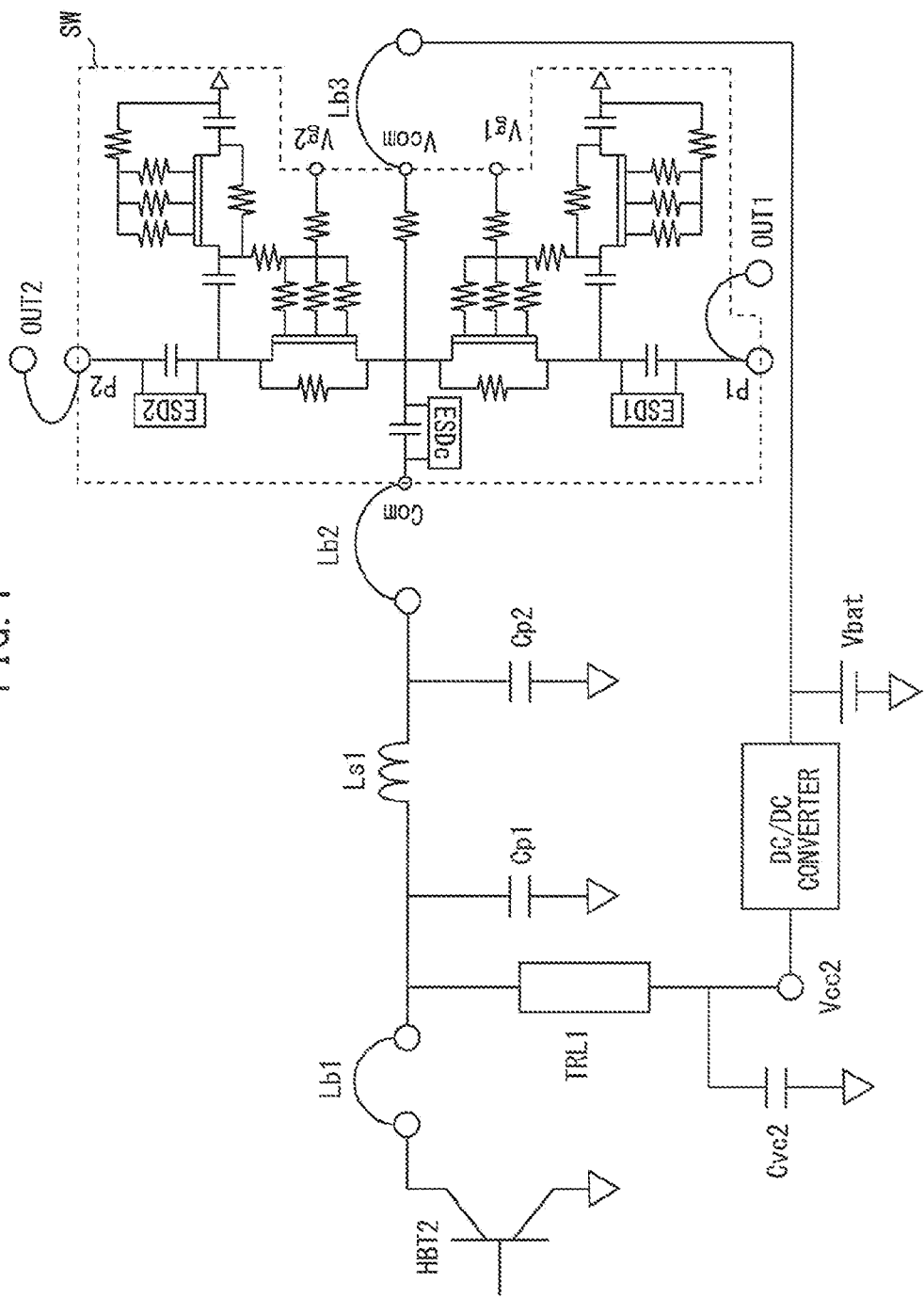
FIG. 1 is a diagram illustrating a power amplifier module according to a first embodiment of the present invention.

FIG. 1 is a diagram illustrating a power amplifier module according to a first embodiment of the present invention. An output matching circuit is provided at an output of a power amplifier HBT2 at a final stage of a GaAs power amplifier (PA) for a portable terminal and an RF switch SW is connected to a subsequent stage thereof. Lb1 to Lb3 are bonding wires, TRL1 is a collector current supply line of the power amplifier HBT2, Ls1 is an output matching inductance, Cp1 and Cp2 are output matching capacitances, and Cvc2 is a decoupling capacitor. A DC/DC converter converts a battery voltage Vbat (normally approximately 3.7 V) to an appropriate DC voltage Vcc2 (normally 3.4 V, or 3.4 to 0.5 V depending on cases).

Figure 2:
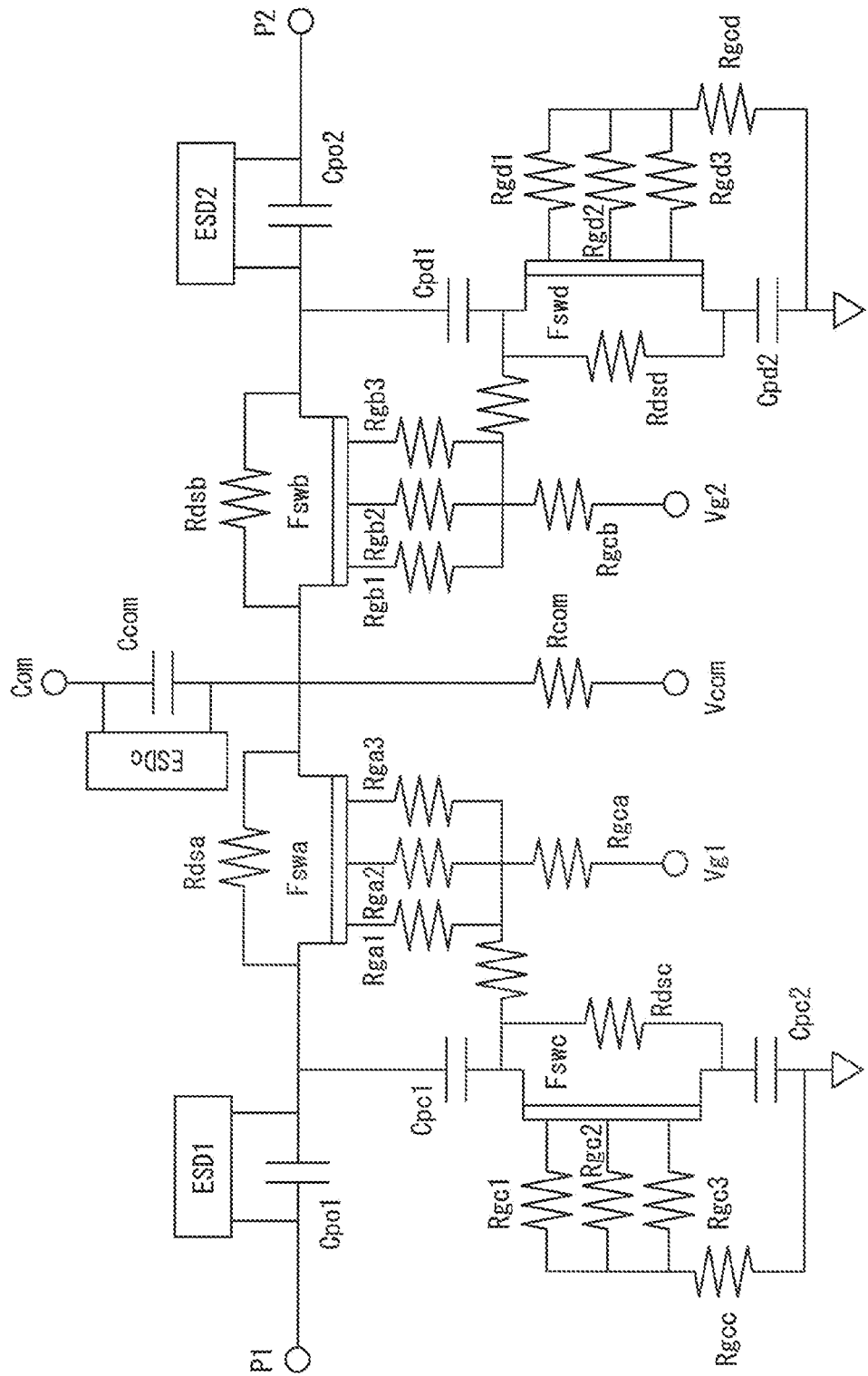
FIG. 2 is a diagram illustrating an RF switch according to the first embodiment of the present invention.

FIG. 2 is a diagram illustrating an RF switch according to the first embodiment of the present invention. Transistors Fswa, Fswb, Fswc and Fswd are D-mode HEMT (high-electron mobility transistors) having a triple gate structure. Capacitors Cpc1, Cpc2, Cpd1 and Cpd2 have an MIM capacitor (metal-insulator-metal) structure and surface mount parts (SMD: surface mount devices) are used for reasons related to low loss characteristics and sizes. Resistors Rcom, Rdsa to Rdsd, Rga1 to Rga3, Rgb1 to Rgb3, Rgc1 to Rgc3, Rgd1 to Rgd3, and Rgca to Rgcd have resistance values of several kΩ to several tens of kΩ.

The transistors Fswa and Fswb are connected between an input terminal Com and output terminals P1 and P2 respectively. An MIM capacitor Ccom is connected between the input terminal Com and the transistors Fswa and Fswb. MIM capacitors Cpo1 and Cpo2 are connected between the output terminals P1 and P2, and the transistors Fswa and Fswb respectively. ESD protection circuits ESDc, ESD1 and ESD2 are connected in parallel to the MIM capacitors Ccom, Cpo1 and Cpo2 respectively to protect the MIM capacitors Ccom, Cpo1 and Cpo2 provided in series to the input/output terminals respectively from ESD (electrostatic discharge).

Next, operation of the RF switch according to the present embodiment will be described. A positive DC voltage is applied between drains and sources of the transistors Fswa, Fswb, Fswc and Fswd of the RF switch using a battery voltage Vbat. For example, 3.4 V is often applied as the battery voltage Vbat in portable terminals By applying a positive or 0 V (voltage Vbat or 0 V) gate voltage to control terminals Vg1 and Vg2, it is possible to control the RF switch SW using a D-mode HEMT without using any negative voltage.

More specifically, when the battery voltage Vbat (=3.4 V) is applied to the control terminal Vg1 and 0 V is applied to the control terminal Vg2, the transistor Fa is turned ON, the transistor Fb is turned OFF, the transistor Fc is turned OFF, the transistor Fd is turned ON, and the route from the input terminal Com to the output terminal P1 becomes an ON state and the route from the input terminal COM to the output terminal P2 becomes an OFF state. On the other hand, when 0 V is applied to the control terminal Vg1 and the battery voltage Vbat is applied to the control terminal Vg2, the route from the input terminal Com to the output terminal P1 becomes an OFF state and the route from the input terminal COM to the output terminal P2 becomes an ON state.

In order to allow such control, the RF switch SW is configured using the MIM capacitors Cpc1, Cpc2, Cpd1 and Cpd2 so that the battery voltage Vbat can be applied to drain-source voltages of the transistors Fc and Fd of the parallel arms.

The ESD protection circuits ESDc, ESD1 and ESD2 cause an ESD surge entering from output terminals OUT1 or OUT2 to pass through the input terminal COM. The ESD surge that has passed therethrough arrives at the collector of the power amplifier HBT2, the ESD surge causes the power amplifier HBT2 to turn ON to thereby cause the high current ESD surge to be released to GND. Providing the ESD protection circuits ESD1, ESD2 and ESDc parallel to the MIM capacitors Cpo1, Cpo2 and Ccom through which the RF signal passes allows the RF switch SW to be protected from the ESD surge.

Figure 3:
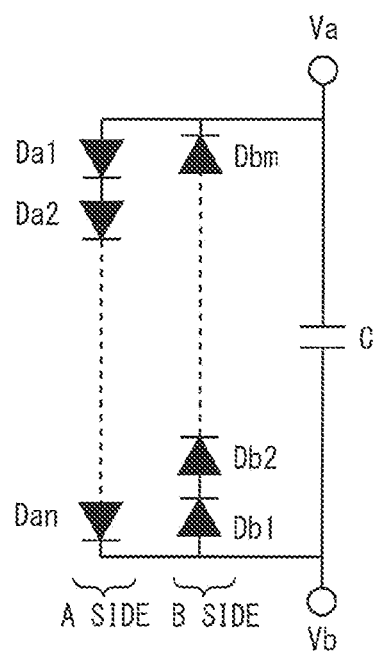
FIG. 3 is a diagram illustrating an ESD protection circuit according to the first embodiment of the present invention.

FIG. 3 is a diagram illustrating an ESD protection circuit according to the first embodiment of the present invention. The ESD protection circuit is connected in parallel to an MIM capacitor C between a first terminal Va and a second terminal Vb. The ESD protection circuit corresponds to the ESD protection circuit ESDc, ESD1 and ESD2 in FIG. 2 and the MIM capacitor C corresponds to the MIM capacitors Ccom, Cpo1 and Cpo2 in FIG. 2.

Schottky diodes Da1, ..., Dan are connected in series to each other, an anode of which is connected on the first terminal Va side and a cathode of which is connected on the second terminal Vb side. Schottky diodes Db1, ..., Dbm are connected in series to each other, and connected in antiparallel to the Schottky diodes Da1, ..., Dan.

When an RF signal is inputted to neither the first terminal Va nor the second terminal Vb, the first terminal Va has a higher DC voltage than that of the second terminal Vb. The number of the Schottky diodes Da1, ..., Dan is greater than the number of Schottky diodes Db1, ..., Dbm. The number of the Schottky diodes Db1, ..., Dbm is set such that the amplitude of the RF signal does not attenuate to predetermined amplitude of the RF signal when an RF signal passes through the MIM capacitor C.

Figure 4:
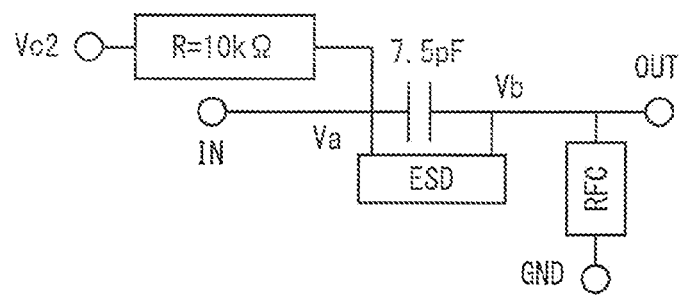
FIG. 4 is a diagram illustrating a circuit whereby a voltage waveform generated between both ends of the MIM capacitor is calculated when an RF signal is caused to pass through the MIM capacitor provided with the ESD protection circuit in FIG. 3.
Figure 5:
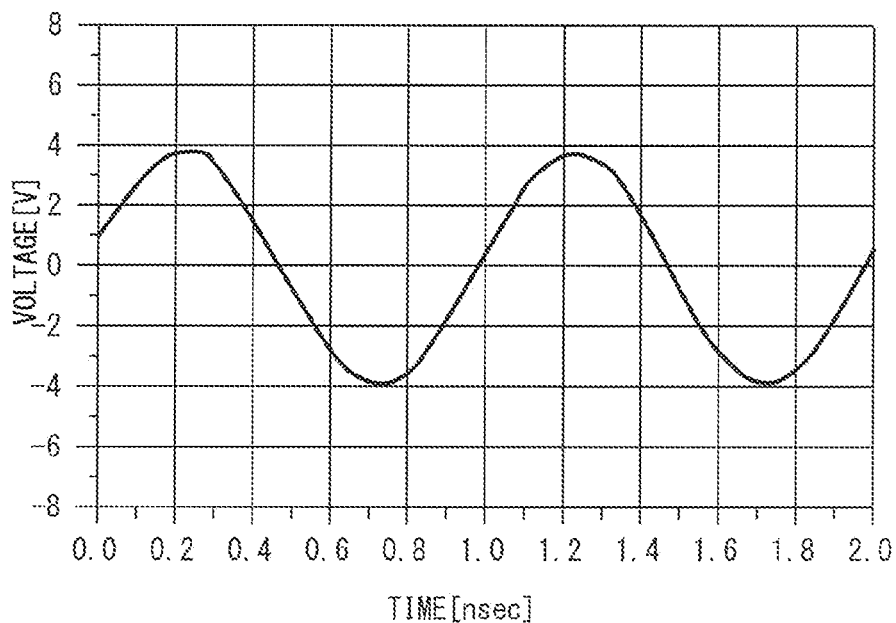
FIG. 5 is a diagram illustrating a calculation result wherein a voltage waveform generated between both ends of the MIM capacitor is calculated when an RF signal is caused to pass through the MIM capacitor provided with the ESD protection circuit in FIG. 3.

FIG. 4 and FIG. 5 are diagrams illustrating a circuit whereby a voltage waveform generated between both ends of the MIM capacitor is calculated when an RF signal is caused to pass through the MIM capacitor provided with the ESD protection circuit in FIG. 3 and the calculation result respectively. Here, the MIM capacitor has a capacitance of 10 pF, and the RF signal has a frequency of 1 GHz and power of 30 dBm. It is clear that the voltage amplitude generated between both ends of the MIM capacitor is 4 V. Therefore, when an RF switch with power handling capability of 30 dBm (=1 W) is designed, the number of diodes of the ESD protection circuit is preferably set such that the diodes are not turned ON with the voltage amplitude of 4 V.

On the other hand, it is necessary to set the number of diodes by taking into account the fact that a battery voltage Vbat (=3.4 V) and a DC voltage Vcc2 are applied to the RF switch SW. Table 1 shows an example of a potential difference between both ends of the ESD protection circuit.

TABLE 1

| | Vbat | Vcc2 | | A side | B side |
|---|---|---|---|---|---|
| | | | Potential difference at ESD1, ESD2 | | |
| Standard | 3.4 V | 3.4 V | 3.4 V | 11 or more diodes | 6 or more diodes |
| | | | Potential difference at ESDc | | |
| When Vcc2 is low | 3.4 V | 0.5 V | Maximum 2.9 V | 10 or more diodes | 6 or more diodes |

For example, in the cases of the ESD1 and ESD2, if Vbat=3.4 V, the voltages of the output terminals OUT1 and OUT2 are 0 V, a DC voltage of 3.4 V is always applied. On the other hand, in the case of the ESDc and Vcc2=3.4 V, the potential difference between both ends of ESDc is 0 V, but if Vcc2 is reduced to 0.5 V by the DC/DC converter (which corresponds to a case where the output of the power amplifier is low), the potential difference is a maximum of 2.9 V. With this potential difference and the RF amplitude taken into consideration, if a barrier potential per diode is assumed to be 0.7 V, it is clear as shown in Table 1 that the number of diodes for the ESD1 and ESD2 is preferably 11 or more on the A side and 6 or more on the B side. Similarly, the number of diodes for the ESDc is preferably 10 or more on the A side and 6 or more on the B side.

Diodes need to be arranged in multiple stages from the standpoint of a leakage current during DC bias and securing of power handling capability characteristics during power operation. Even when the number of diodes is set to a minimum necessary number, the number of diodes described in Table 1 is necessary when the ESD protection circuit is applied to mobile phones. For this reason, when the ESD protection circuit is actually mounted on a SW chip, miniaturization of diodes (junction area and gate width) is a key issue.

Figure 6:
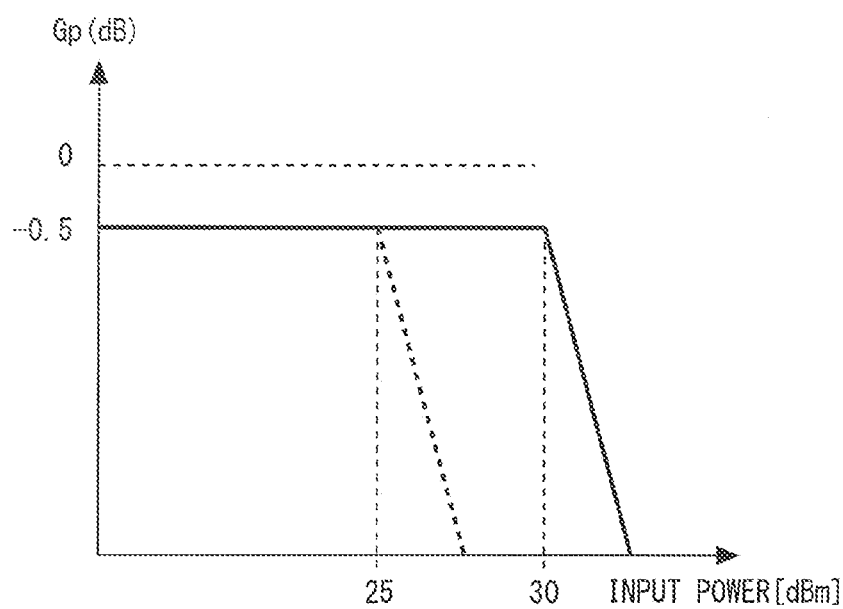
FIG. 6 is a diagram schematically illustrating a difference in power handling capability characteristics between a case where the number of diodes is appropriately set and an otherwise case.

FIG. 6 is a diagram schematically illustrating a difference in power handling capability characteristics between a case where the number of diodes is appropriately set and an otherwise case. Based on the number of diodes in Table 1, a transmission power characteristic equal to or higher than 30 dBm is obtained with respect to a goal which is equal to or higher than 30 dBm (=1 W). In this way, regarding the number of diodes of the ESD protection circuit provided for the MIM capacitor of the RF switch SW that acts as a function to switch between bands on the output side of the power amplifier, it is clear that there is an optimum value derived from applying a bias voltage to the RF switch SW and the optimum value can be set asymmetrically.

Figure 7:
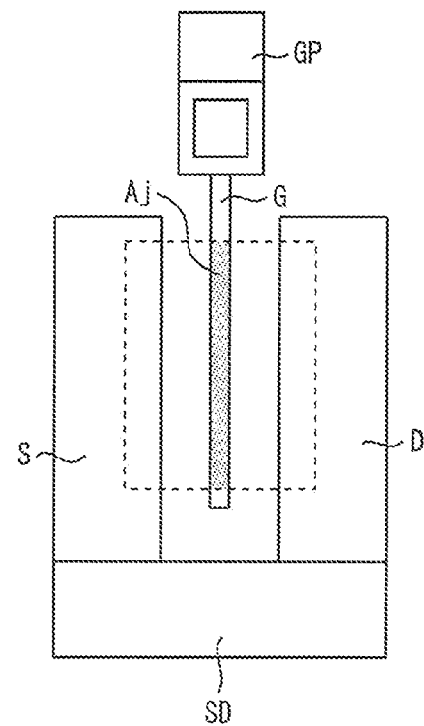
FIG. 7 is a plan view illustrating a general diode using a D-mode HEMT.

FIG. 7 is a plan view illustrating a general diode using a D-mode HEMT. A source electrode S and a drain electrode D are connected together by a connection electrode SD in the same layout as that of an FET. Since a gate electrode G is narrow, the cross-sectional area through which a current flows from a gate pad GP to the gate electrode G is small. For this reason, when an ESD surge current flows, the electrodes are more liable to blow out due to an overcurrent at the connection between the gate pad GP and the gate electrode G. Thus, it is a common practice that a plurality of gates are arranged. Therefore, the size of the diode increases.

Figure 8:
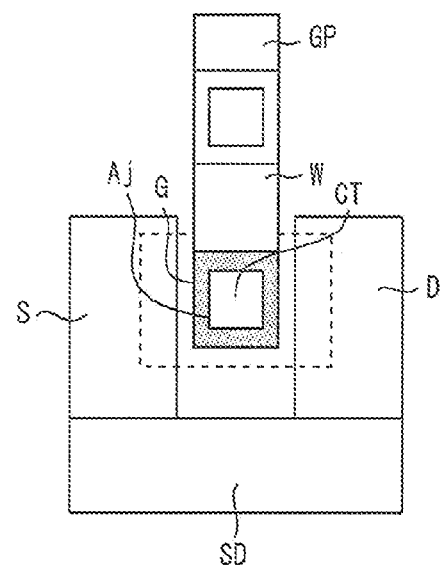
FIG. 8 is a plan view illustrating a diode according to a first embodiment of the present invention.

FIG. 8 is a plan view illustrating a diode according to a first embodiment of the present invention. The gate electrode G is thickened and a first layer wiring W is connected to the top thereof via a contact CT. The wiring thickness of the first layer wiring W is much thicker than the gate electrode G. The gate electrode G is connected to the gate pad GP via this first layer wiring W. This reduces the possibility that blow-out may occur due to an overcurrent and allows the diode to be configured in a considerably small size. When the area of a junction part Aj between the gate electrode G and the substrate is the same as that of the structure in FIG. 7, a condition for achieving comparable ON resistance is proven by experiments to be a threshold voltage Vth of the D-mode HEMT being −0.5 V or less. The size of the diode can be reduced to half or less by adopting the structure in FIG. 8 that satisfies this condition.

Figure 9:
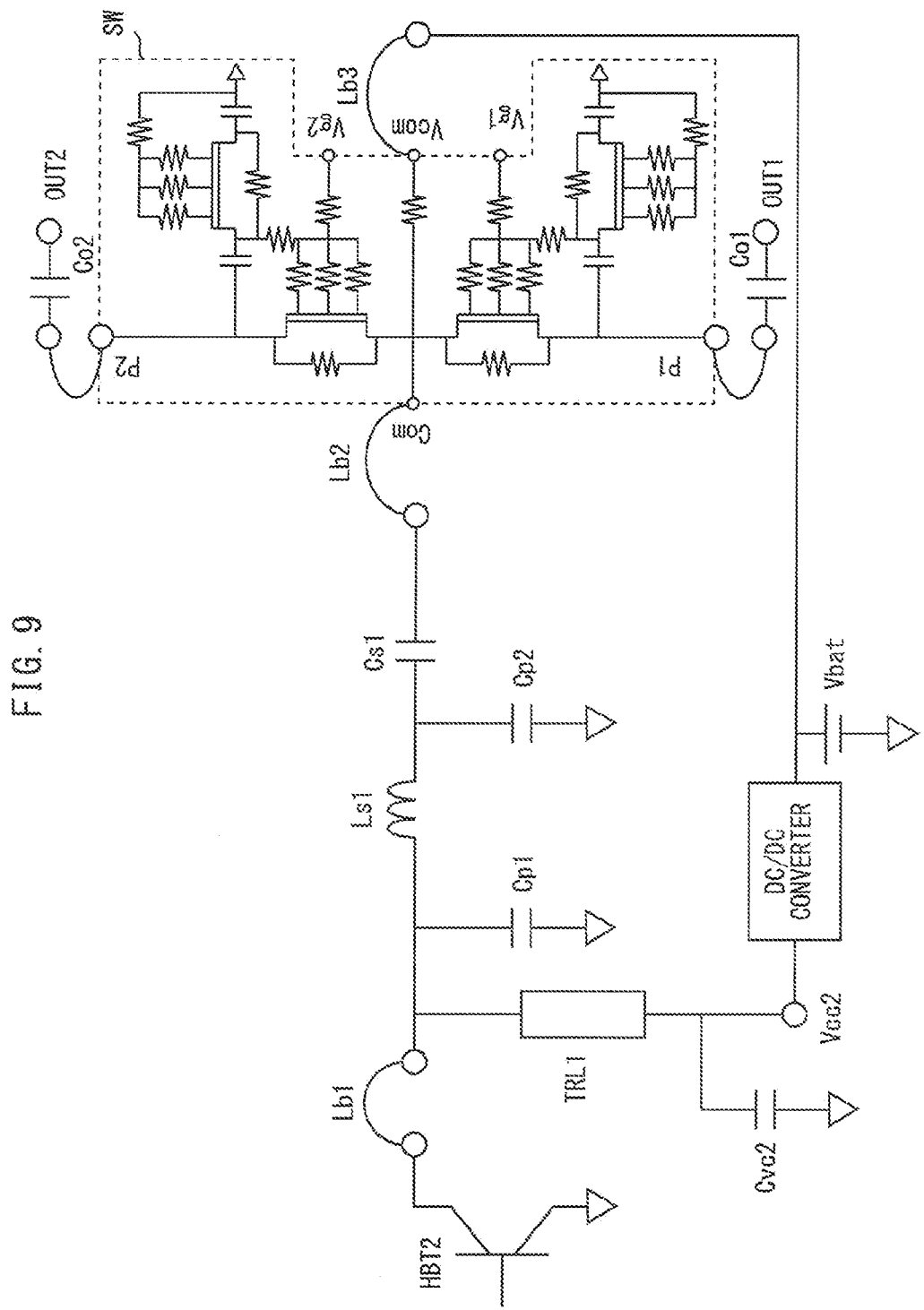
FIG. 9 is a diagram illustrating a power amplifier module according to comparative example 1.

Next, effects of the present embodiment will be described in comparison with comparative examples. FIG. 9 is a diagram illustrating a power amplifier module according to comparative example 1. Cs1 is an output matching capacitance. DC cut capacitors Co1 and Co2 are provided between output terminals OUT1 and OUT2, and GND respectively. Since no ESD protection circuit is provided in comparative example 1, it is not possible to protect the inside of the switch SW from ESD.

Figure 10:
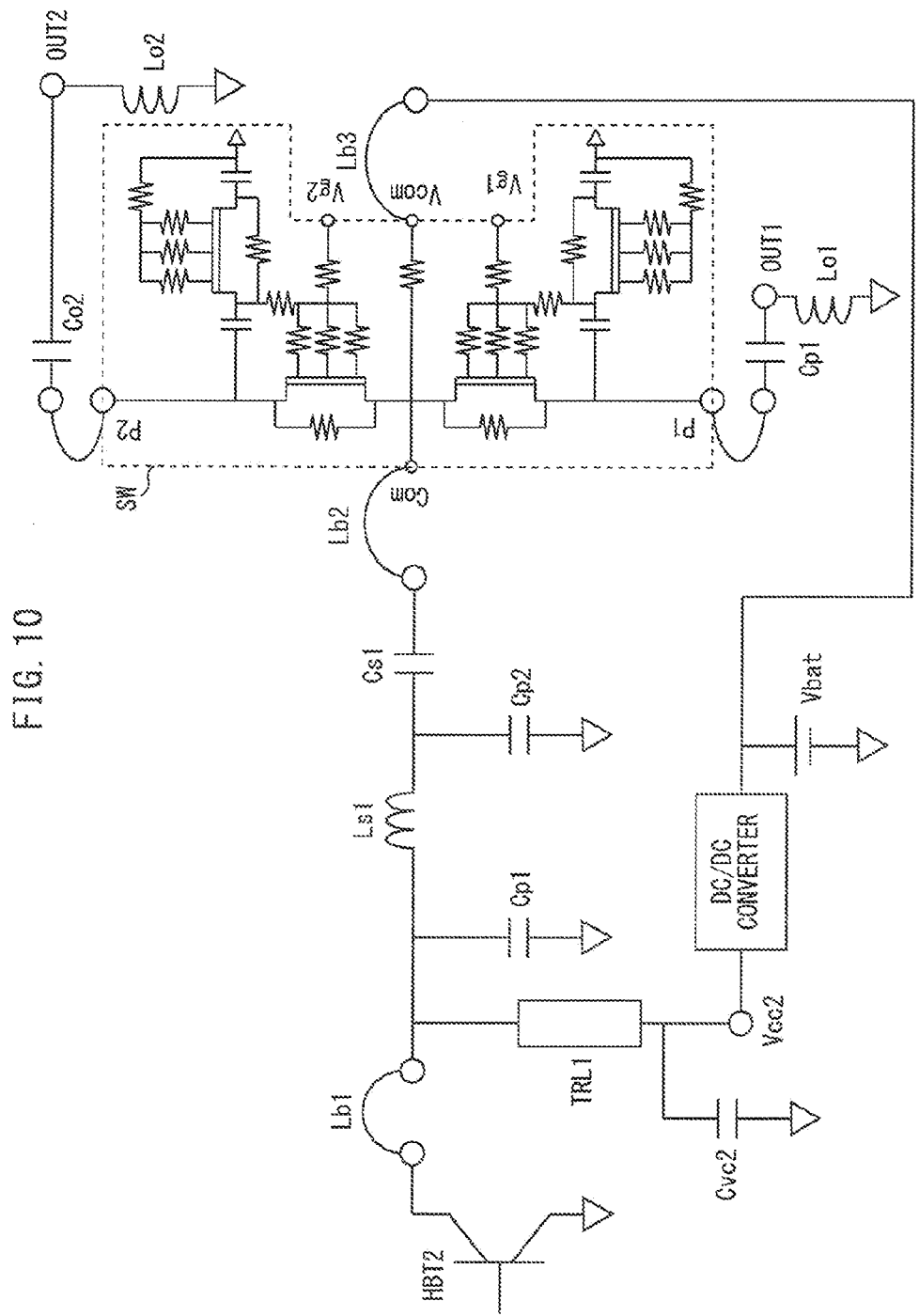
FIG. 10 is a diagram illustrating a power amplifier module according to comparative example 2.

FIG. 10 is a diagram illustrating a power amplifier module according to comparative example 2. Inductors Lo1 and Lo2 are provided between output terminals OUT1 and OUT2, and GND respectively in addition to the configuration of comparative example 1. The Lo1 and Lo2 have an inductance of on the order of 27 to 56 nH and have substantially no influence on an RF signal in a 0.7 to 2.7 GHz band, but function as a short circuit when an ESD surge enters. Therefore, it is possible to protect the inside of the switch SW from ESD. Note that ESD protection circuits may also be provided at locations corresponding to the inductors Lo1 and Lo2 of comparative example 2. However, since the RF voltage amplitude of the output terminals OUT1 and OUT2 is as high as approximately 10 to 14 V, the ESD protection circuit needs to be designed so as not to function with that RF amplitude. This normally involves an extremely large increase of the chip area. Especially in a process provided with only a D-mode HEMT, the number of Schottky junction diodes used as an ESD protection circuit is extremely large, which is not practical from the standpoint of the occupied area.

In contrast, since the present embodiment provides the ESD protection circuits ESDc, ESD1 and ESD2, it is possible to protect the inside of the switch SW from ESD. Moreover, since there is no need to provide the inductors Lo1 and Lo2 of comparative example 2, it is possible to reduce an increase in the chip size.

The present embodiment asymmetrically sets the numbers of diodes, and can thereby suppress leakage during DC bias with the smallest number of diodes, minimize ON resistance and allow an ESD surge to pass therethrough with lowest resistance. It is thereby possible to protect the MIM capacitor provided in series to the input/output terminals without affecting transmission power characteristics. By setting the number of diodes to a minimum, it is possible to reduce an increase in the chip size of the RF switch SW caused by providing the ESD protection circuits ESDc, ESD1 and ESD2.

In addition, the present embodiment can achieve HBM of 1 kV or more as ESD resistance and 1 W or more as power handling capability in an RF switch with MIM capacitors provided in series to the input/output terminals. As a result, it is possible to make ESD resistance compatible with RF characteristics in a power amplifier module with a built-in switch to which a power amplifier and an RF switch are connected. Moreover, since the circuit size of the ESD protection circuit provided in the RF switch is also relatively small, it is possible to reduce a cost increase.

While the Fswa and Fswb in the serial arm have a large gate width, and are therefore resistant to ESD surge, the Fswc and Fswd in the parallel arm have a small gate width compared to that of the Fswa and Fswb, and are therefore relatively weak to ESD surge. However, the ESD protection circuits ESDc, ESD1 and ESD2 cause the ESD surge that enters from the output terminals OUT1 and OUT2 to pass through the input terminal COM, which eliminates the necessity for the Cpc1, Cpc2, Cpd1 and Cpd2 in the Fswc and Fswd directions to be provided with ESD protection circuits. It is possible to reduce an increase in the chip size in this respect as well.

Moreover, the series capacitance Ccom provided in the last part of the power amplifier matching circuit is provided with an ESD protection circuit. In this way, it is possible to freely set the collector voltage Vcc2 of the power amplifier HBT2 using the DC/DC converter while securing resistance to ESD surge that enters from the output terminals OUT1 and OUT2 of the RF switch SW. Moreover, since the MIM capacitors Ccom, Cpo1 and Cpo2 are provided in the RF switch SW, it is possible to contribute to miniaturization of the entire module.

Second Embodiment

Figure 11:
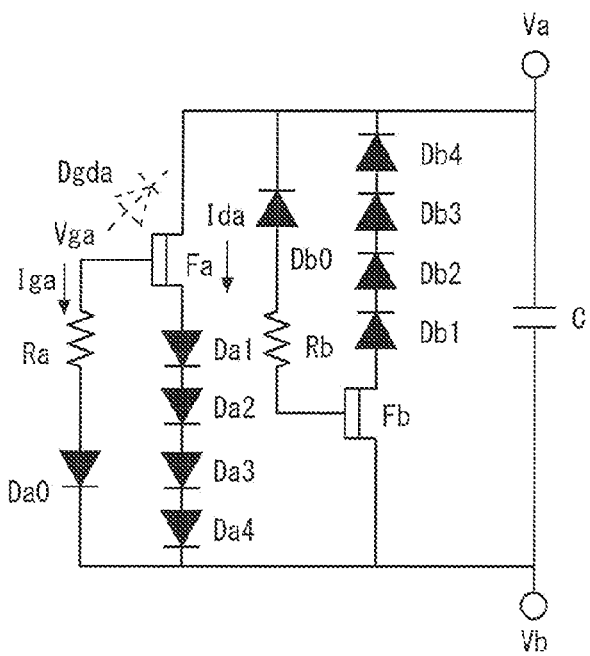
FIG. 11 is a diagram illustrating an ESD protection circuit according to a second embodiment of the present invention.

FIG. 11 is a diagram illustrating an ESD protection circuit according to a second embodiment of the present invention. The ESD protection circuit is connected in parallel to an MIM capacitor C between a first terminal Va and a second terminal Vb. The ESD protection circuit corresponds to the ESD protection circuits ESDc, ESD1 and ESD2 in FIG. 2 and the MIM capacitor C corresponds to the MIM capacitors Ccom, Cpo1 and Cpo2 in FIG. 2.

A first ESD protection circuit includes a depletion-mode (D-mode) and field-effect type transistor Fa, Schottky diodes Da1, ..., Da4 connected in series to each other, a Schottky diode Da0 and a resistor Ra. A drain of the transistor Fa is connected to the first terminal Va. A source of the transistor Fa is connected to anodes of the Schottky diodes Da1, ..., Da4. A gate of the transistor Fa is connected to an anode of the Schottky diode Da0. Cathodes of the Schottky diodes Da1, ..., Da4 are connected to a cathode of the Schottky diode Da0, and are also connected to the second terminal Vb. The resistor Ra is connected in series to the Schottky diode Da0. A product of built-in voltages of the Schottky diodes Da1, ..., Da4 and the number of diodes is higher than a threshold voltage of the transistor Fa.

A second ESD protection circuit includes a depletion-mode (D-mode) and field-effect type transistor Fb, Schottky diodes Db1, ..., Dbm connected in series to each other, a Schottky diode Db0 and a resistor Rb. A drain of the transistor Fb is connected to the second terminal Vb. A source of the transistor Fb is connected to anodes of the Schottky diodes Db1, ..., Dbm. A gate of the transistor Fb is connected to an anode of the Schottky diode Db0. Cathodes of the Schottky diode Db1, ..., Dbm and a cathode of the Schottky diode Db0 are connected to each other, and also connected to the first terminal Va. The resistor Rb is connected in series to the Schottky diode Db0. A product of built-in voltages of the Schottky diodes Db1, ..., Dbm and the number of diodes is higher than a threshold voltage of the transistor Fb.

The diodes Da0 and Db0 are connected in a direction opposite to that of a Schottky junction (e.g., DgDa0) formed between the gate and the drain of the Fa or Fb. For this reason even when a voltage alternates between the first terminal Va and the second terminal Vb, a gate current Iga is not likely to flow. Therefore, the ESD protection circuit according to the present embodiment can operate without loss even at a location such as both ends of the MIM capacitor C where a voltage alternates between positive and negative levels.

Figure 12:
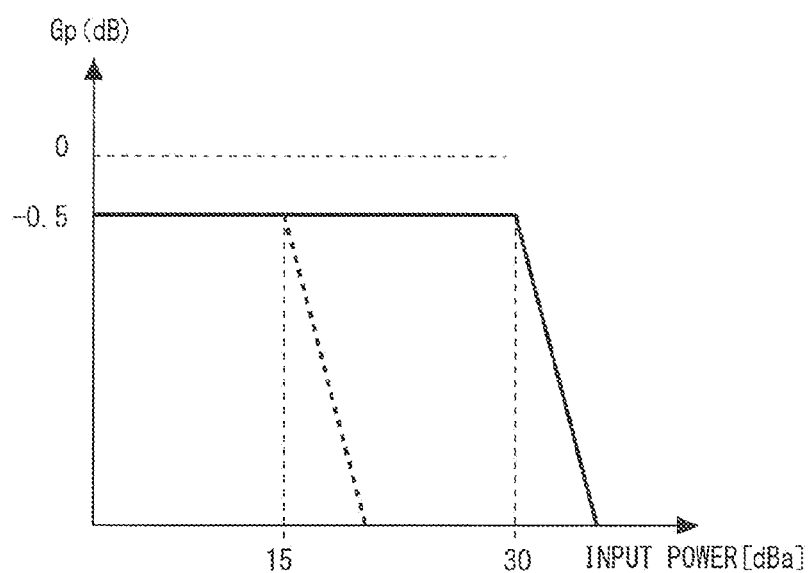
FIG. 12 is a diagram illustrating a characteristic example of power handling capability of an RF switch using the ESD protection circuit according to the second embodiment of the present invention.

FIG. 12 is a diagram illustrating a characteristic example of power handling capability of an RF switch using the ESD protection circuit according to the second embodiment of the present invention. In this way, it is possible to improve power handling capability.

Figure 13:
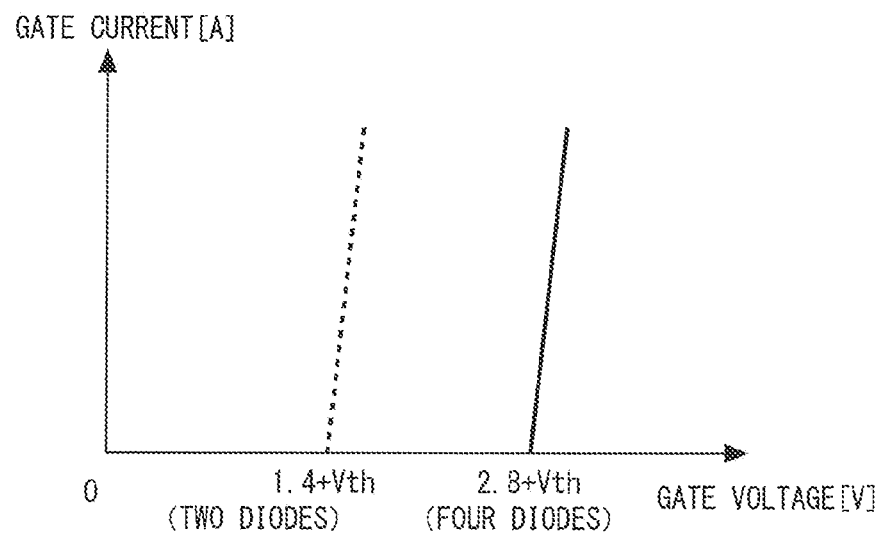

FIG. 13 is a diagram illustrating a gate voltage at which the transistor of the ESD protection circuit according to the second embodiment of the present invention is turned ON. The gate voltage at which the transistors Fa and Fb are turned ON differs depending on a difference in the number of diodes provided on the source side of the transistors Fa and Fb of the ESD protection circuit. This number of diodes differs depending on a threshold voltage Vth of the Fa and Fb. When Vth is relatively shallow, the number of diodes may be smaller. When Vth is deep, the number of diodes needs to be increased to reduce a DC leakage current.

The ESD protection circuit of the first embodiment needs to be configured of multiple diodes and there is a limitation in downsizing of the circuit dimensions. In contrast, the ESD protection circuit of the present embodiment can be downsized more than the first embodiment by using the transistors Fa and Fb.

Third Embodiment

Figure 14:
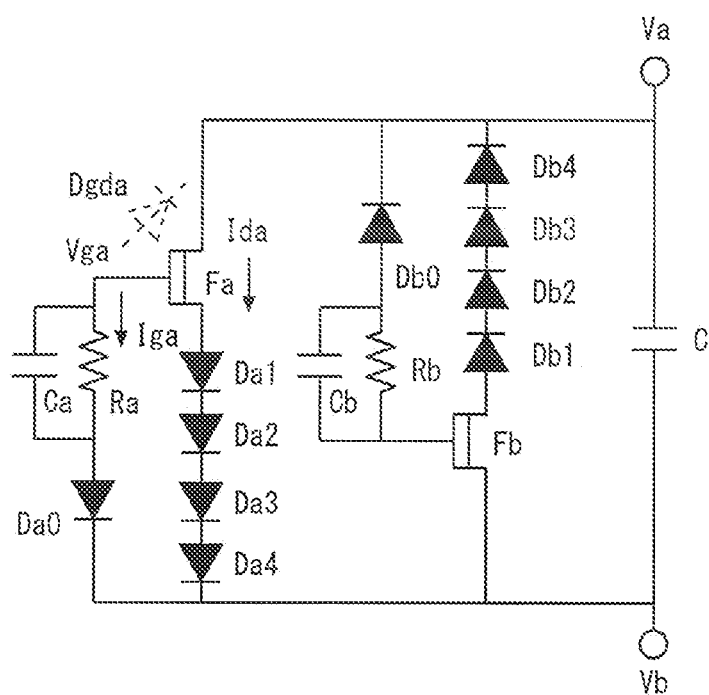
FIG. 14 is a diagram illustrating an ESD protection circuit according to a third embodiment of the present invention.

FIG. 14 is a diagram illustrating an ESD protection circuit according to a third embodiment of the present invention. MIM capacitors Ca and Cb are connected in parallel to resistors Ra and Rb respectively. The Ca and Cb have capacitances of several pF, which are sufficiently smaller than a dozen pF or so which is a capacitance of a capacitor C to be protected. The rest of the configuration is similar to that of the second embodiment.

In the ESD protection circuit of the second embodiment, the resistance values of the resistors Ra and Rb, and the number of diodes on the source side are related to power handling capability and ESD surge resistance (capacity indicating how high a current can flow instantaneously). A voltage drop Ra·Iga is produced when an RF current alternating between the first terminal Va and the second terminal Vb passes through the resistor Ra. When the resistor Ra is large, the Ra·Iga increases and the Fa is more liable to turn ON. When the Fa is liable to turn ON, there is a tradeoff that a current is likely to flow when a surge is applied but during an RF operation, a potential difference produced between both ends of the MIM capacitor is suppressed, causing power handling capability to decrease.

The capacitors Ca and Cb substantially short-circuit the resistors Ra and Rb at a GHz class frequency of an RF signal and the resistors Ra and Rb effectively act on an MHz class ESD surge. For this reason, the addition of the capacitors Ca and Cb can resolve the above-described tradeoff. However, the addition of the capacitors Ca and Cb causes the circuit dimension to slightly increase compared to the second embodiment.

Figure 15:
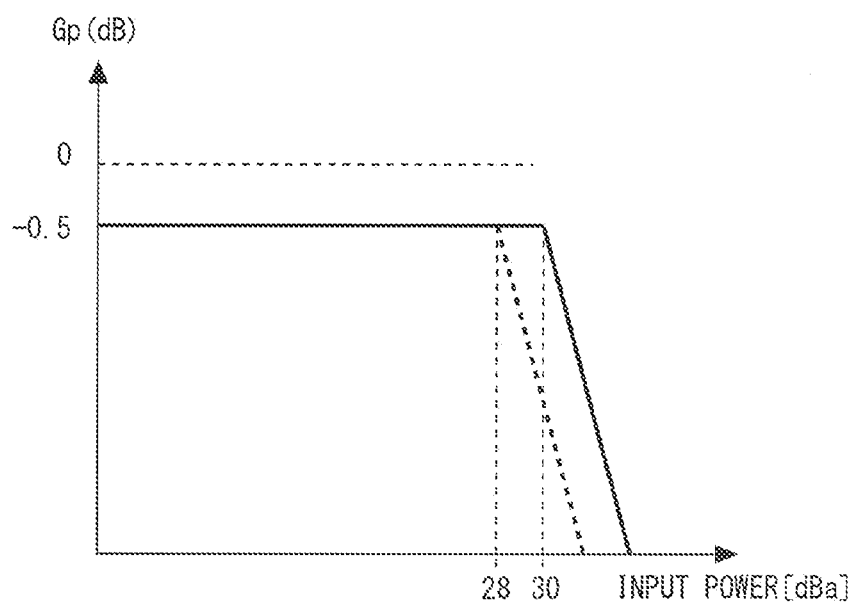
FIG. 15 is a diagram illustrating a characteristic example of allowable transmission power of an RF switch using the ESD protection circuit according to the third embodiment of the present invention.
Figure 16:
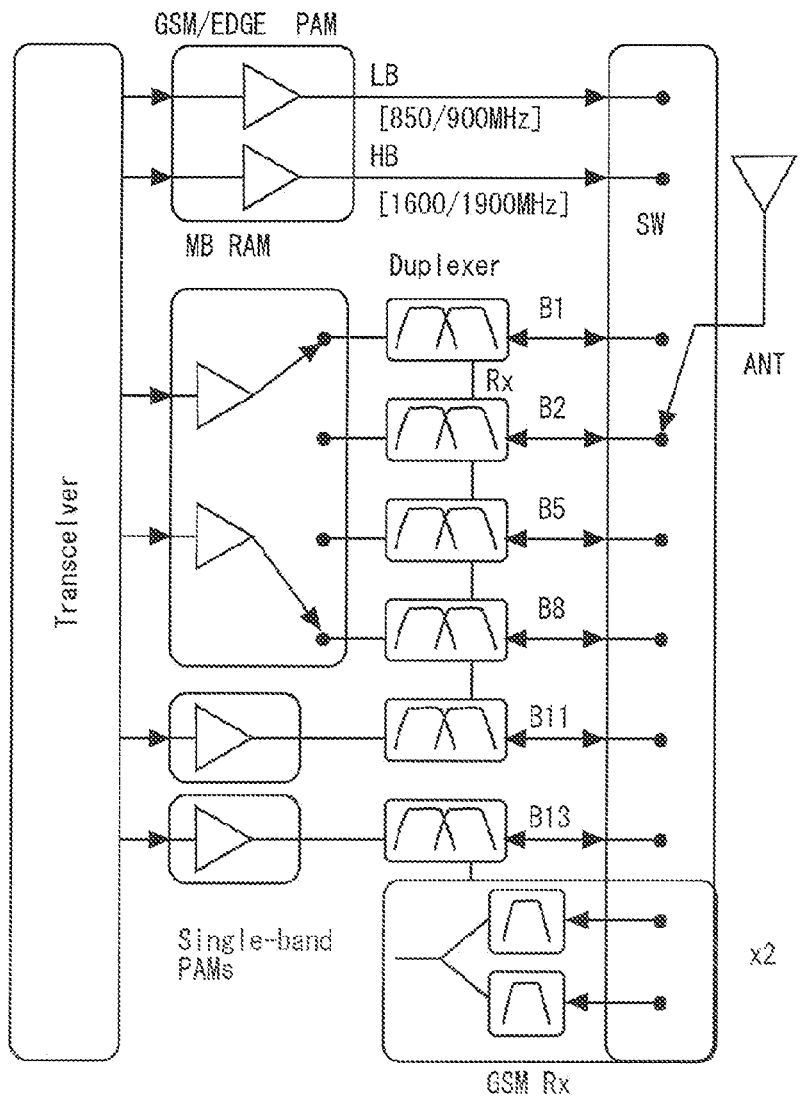
FIG. 16 is a diagram illustrating a mobile phone RF front-end block.
Figure 17:
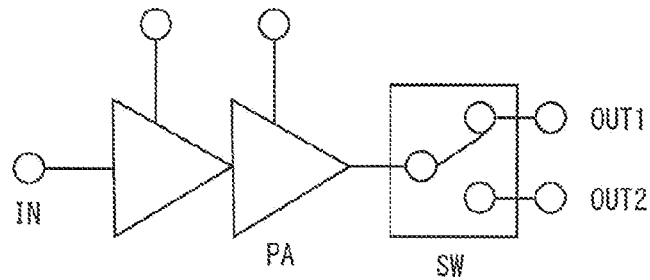
FIG. 17 is a functional block diagram that extracts a chain on one side of the multi-band power amplifier module.

FIG. 15 is a diagram illustrating a characteristic example of power handling capability of an RF switch using the ESD protection circuit according to the third embodiment of the present invention. In this way, it is possible to prevent the ESD surge resistance from decreasing while improving power handling capability.

Effects similar to those of the first embodiment can be obtained even when the ESD protection circuit of the power amplifier module in FIG. 1 is changed to the ESD protection circuit of the second or third embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-241931, filed on Nov. 28, 2014 including specification, claims, drawings and summary, on which the Convention priority of the present application is based, is incorporated herein by reference in its entirety.

What is claimed is:

1. An ESD protection circuit connected in parallel to a MIM capacitor between a first terminal and a second terminal, comprising first and second ESD protection circuits connected in anti-parallel to each other, the first ESD protection circuit includes a first transistor being depression-mode and field-effect type, a plurality of first Schottky diodes connected in series to each other, a second Schottky diode and a first resistor, a drain of the first transistor is connected to the first terminal, a source of the first transistor is connected to anodes of the plurality of first Schottky diodes, a gate of the first transistor is connected to an anode of the second Schottky diode, cathodes of the plurality of first Schottky diodes are connected to a cathode of the second Schottky diode and are connected to the second terminal, the first resistor is connected in series to the second Schottky diode, a product of built-in voltage and the number of the plurality of first Schottky diodes is higher than a threshold voltage of the first transistor, the second ESD protection circuit includes a second transistor being depression-mode and field-effect type, a plurality of third Schottky diodes connected in series to each other, a fourth Schottky diode and a second resistor, a drain of the second transistor is connected to the second terminal, a source of the second transistor is connected to anodes of the plurality of third Schottky diodes, a gate of the second transistor is connected to an anode of the fourth Schottky diode, cathodes of the plurality of third Schottky diodes are connected to a cathode of the fourth Schottky diode and are connected to the first terminal, the second resistor is connected in series to the fourth Schottky diode, and a product of built-in voltage and the number of the plurality of third Schottky diodes is higher than a threshold voltage of the second transistor.

2. The ESD protection circuit according to claim 1, further comprising first and second MIM capacitors connected in parallel to the first and second resistors respectively.

3. An RF switch connected to an output of a power amplifier, comprising:

an input terminal;

an output terminal;

a transistor being a depletion-mode HEMT connected between the input terminal and the output terminal;

a third MIM capacitor connected between the input terminal and the transistor;

a fourth MIM capacitor connected between the output terminal and the transistor; and first and second ESD protection circuits connected in parallel to the third and fourth MIM capacitors respectively, wherein the first and second ESD protection circuits are the ESD protection circuits according to claim 1.

* * * * *